(12) United States Patent
Czaplewski et al.

(10) Patent No.: US 9,668,354 B2
(45) Date of Patent: May 30, 2017

(54) CONFORMAL COATING MATERIALS

(71) Applicant: International Business Machines Corporation, Armonk, NY (US)

(72) Inventors: Sarah K. Czaplewski, Rochester, MN (US); Joseph Kuczynski, North Port, FL (US); Jason T. Wertz, Pleasant Valley, NY (US); Jing Zhang, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/807,594

(22) Filed: Jul. 23, 2015

(65) Prior Publication Data

US 2017/0027064 A1    Jan. 26, 2017

(51) Int. Cl.
| | | |
|---|---|---|
| B29C 65/52 | (2006.01) |
| B32B 37/14 | (2006.01) |
| B32B 37/26 | (2006.01) |
| B32B 38/10 | (2006.01) |
| B32B 43/00 | (2006.01) |
| H05K 3/28 | (2006.01) |
| H05K 1/02 | (2006.01) |
| H05K 3/00 | (2006.01) |
| H05K 3/46 | (2006.01) |

(52) U.S. Cl.
CPC ............... *H05K 3/28* (2013.01); *H05K 1/02* (2013.01); *H05K 3/0058* (2013.01); *H05K 3/0079* (2013.01); *H05K 3/4644* (2013.01)

(58) Field of Classification Search
USPC ......................................... 156/247, 701, 711
See application file for complete search history.

(56) References Cited

U.S. PATENT DOCUMENTS

| | | | |
|---|---|---|---|
| 5,449,718 A | 9/1995 | Erickson et al. | |
| 6,219,258 B1* | 4/2001 | Denzene | H01R 13/5219 174/358 |
| 7,041,331 B2 | 5/2006 | Lamola et al. | |
| 7,868,066 B2 | 1/2011 | Fenn | |
| 8,946,886 B1* | 2/2015 | Fuentes | H01L 23/552 257/678 |
| 2012/0045166 A1* | 2/2012 | Trotabas | G02B 6/4403 385/14 |
| 2014/0272113 A1 | 9/2014 | Flaherty et al. | |

FOREIGN PATENT DOCUMENTS

| | | | |
|---|---|---|---|
| CN | 103483605 A | 1/2014 |
| CN | 103642199 A | 3/2014 |
| JP | 4087602 B2 | 5/2008 |
| JP | 4609816 B2 | 1/2011 |
| JP | 2011-181558 A | 9/2011 |

* cited by examiner

*Primary Examiner* — Sing P Chan
(74) *Attorney, Agent, or Firm* — Patterson + Sheridan, LLP

(57) ABSTRACT

In an example, a process for reversibly bonding a conformal coating to a dry film solder mask (DFSM) material is disclosed. The process includes applying a first conformal coating material to a DFSM material. The first conformal coating material includes a first functional group, and the DFSM material includes a second functional group that is different from the first functional group. The process also includes reversibly bonding the first conformal coating material to the DFSM material via a chemical reaction of the first functional group and the second functional group.

16 Claims, 6 Drawing Sheets

CONFORMAL COATING MATERIALS

I. FIELD OF THE DISCLOSURE

The present disclosure relates generally to conformal coating materials.

II. BACKGROUND

The electronics industry designs and tests hardware to be able to withstand typical indoor air environments. While hardware testing results may be satisfactory in typical indoor air environments, such test results may not be indicative of the hardware being suitable for use in harsher indoor air environments. In some cases, component failure may result from corrosion of metallurgy via a corrosive gas environment. Conformal coatings, such as silicones, may be applied in an attempt to reduce a likelihood of component failure in such environments. Examples of corrosive materials include elemental sulfur, $H_2S$, or sulfur oxides. However, accelerated aging testing has revealed that silicones may actually exacerbate the problem (due in part to solubility of sulfur in silicones). Additionally, reworking conformal coatings that are not classified as silicones may be challenging, as such materials may require aggressive solvents that may potentially damage underlying materials.

III. SUMMARY OF THE DISCLOSURE

According to an embodiment, a process for reversibly bonding a conformal coating to a dry film solder mask (DFSM) material is disclosed. The process includes applying a first conformal coating material to a DFSM material. The first conformal coating material includes a first functional group, and the DFSM material includes a second functional group that is different from the first functional group. The process also includes reversibly bonding the first conformal coating material to the DFSM material via a chemical reaction of the first functional group and the second functional group.

According to another embodiment, a printed circuit board is disclosed. The printed circuit board (PCB) includes a PCB substrate, a DFSM material, and a conformal coating material. The DFSM material overlies a first portion of the PCB substrate. The conformal coating material is reversibly bonded to the DFSM material via a cyclic compound.

According to another embodiment, a method of processing a printed circuit board is disclosed. The method includes receiving a PCB that includes a first conformal coating material reversibly bonded to a DFSM material. The method includes de-bonding the first conformal coating material from the DFSM material to form a functionalized DFSM material. The method also includes applying a second conformal coating material to the functionalized DFSM material. The second conformal coating material includes a first functional group. The method further includes reversibly bonding the second conformal coating material to the DFSM material via a chemical reaction of the first functional group and a second functional group of the functionalized DFSM material.

One advantage of the present disclosure is the ability to reversibly bond a conformal coating, such as an epoxy material, to a DFSM material. Another advantage of the present disclosure is that the reversible bond provides the ability to de-bond the conformal coating from the DFSM material (e.g., to rework a component) without the use of aggressive techniques. A further advantage of the present disclosure is that particular conformal coating materials, such as epoxy materials, may provide additional protection from sulfur ingress compared to other conformal coatings, such as silicone materials.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

V. DETAILED DESCRIPTION

Figure 1:
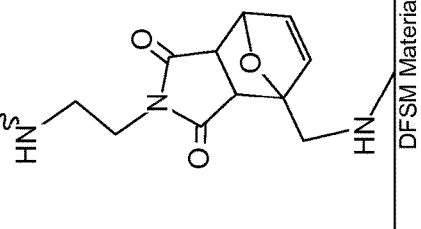
FIG. 1 is a chemical reaction diagram showing a conformal coating material (e.g., an epoxy material) being reversibly bonded to a dry film solder mask (DFSM) material, according to one embodiment.
Figure 1:
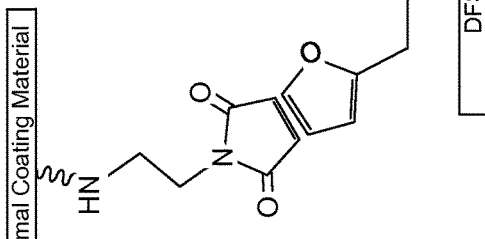

The present disclosure relates to functionalized conformal coating materials and methods of reversibly bonding the functionalized conformal coating materials to a functionalized dry film solder mask (DFSM) material. In the present disclosure, a conformal coating material that includes a first functional group (e.g., a dienophile functional group) may be reversibly bonded to a DFSM material via a chemical reaction of the first functional group with a second functional group (e.g., a diene functional group) of the DFSM material. The present disclosure describes illustrative examples of functionalization of conformal coating materials to include dienophile functional groups and functionalization of DFSM materials to include diene functional groups. One of ordinary skill in the art will appreciate that, in other cases, the conformal coatings may be functionalized to include diene functional groups, and the DFSM materials may be functionalized to include dienophile functional groups.

In the present disclosure, a conformal coating material (e.g., an epoxy resin material) may be modified for use with a modified DFSM material in order to allow the conformal coating material to have both adhesion and dehesion properties. The adhesion properties allow the conformal coating material to be applied to the DFSM material, and the dehesion properties allow the conformal coating material to be removed without the use of aggressive techniques (e.g., solvent-based techniques). Removal of the conformal coating material may allow a component to be reworked. After reworking the component, a conformal coating material may be re-applied and reversibly bonded to the DFSM material.

In the present disclosure, a first functional group (e.g., a dienophile functional group) of a modified conformal coating material may chemically react with a second functional group (e.g., a diene functional group) of a modified DFSM material to reversibly bond the conformal coating material to the DFSM material. To illustrate, Diels-Alder chemistry may be used such that the conformal coating material is reversibly bonded to the DFSM material (e.g., via a cyclic compound that is formed in a Diels-Alder reaction of an alkene functional group with a diene functional group). The reversible nature of the chemical reaction to bond the conformal coating material to the DFSM material may allow the conformal coating material to be removed. To rework a component and/or replace the conformal coating material, the conformal coating material can be de-bonded from the DFSM material (e.g., via a retro Diels-Alder reaction) without the use of aggressive techniques.

As an illustrative example, a DFSM epoxy resin may be functionalized with a diene material and used to create a pre-impregnated material (a "prepreg" material). The functionalized DFSM material may be processed/cured and applied to a printed circuit board (e.g., via vacuum lamination). The conformal coating material may be functionalized to include a dienophile functional group. When in contact with the modified DFSM material, the dienophile functional group of the modified conformal coating material reacts with the diene functional group of the modified DFSM material to covalently bond the two materials together (e.g., via a Diels-Alder reaction). The reaction can undergo a retro Diels-Alder reaction (e.g., by heating above about 130° C. for a particular period of time) to remove the conformal coating material (e.g., to rework a component). Subsequently, a conformal coating material may be re-applied and cooled to reform the bonds between the two materials.

In a particular embodiment, the conformal coating material corresponds to an epoxy conformal coating that may protect against corrosive agent ingress while allowing the epoxy conformal coating to be removed/reworked via a non-aggressive technique. As such, the conformal coating materials of the present disclosure may protect underlying components from corrosive agents (such as sulfur), potentially extending product life. In addition, reversibly bonding the conformal coating to a solder mask material (e.g., a DFSM material) may allow components to be reworked without the potential damage to a PCB laminate material associated with aggressive epoxy coating removal techniques.

Referring to FIG. 1, depicted is a chemical reaction diagram 100 illustrating a conformal coating layer being reversibly bonded to a DFSM material, according to one embodiment. FIG. 1 illustrates that a chemical reaction of a first functional group of a modified conformal coating material and a second functional group of a modified DFSM material may reversibly bond the two materials together. As described further herein with respect to FIG. 2, a DFSM material may be modified to form the modified DFSM material (that includes a diene functional group) that is illustrated in FIG. 1. As described further herein with respect to FIG. 3, a conformal coating material may be modified to form the modified conformal coating material (that includes a dienophile functional group) that is illustrated in FIG. 1. In the example DFSM composite laminate material illustrated in FIG. 1, the conformal coating material is reversibly bonded to the DFSM material via a chemical reaction of the dienophile functional group with the diene functional group.

Figure 4:
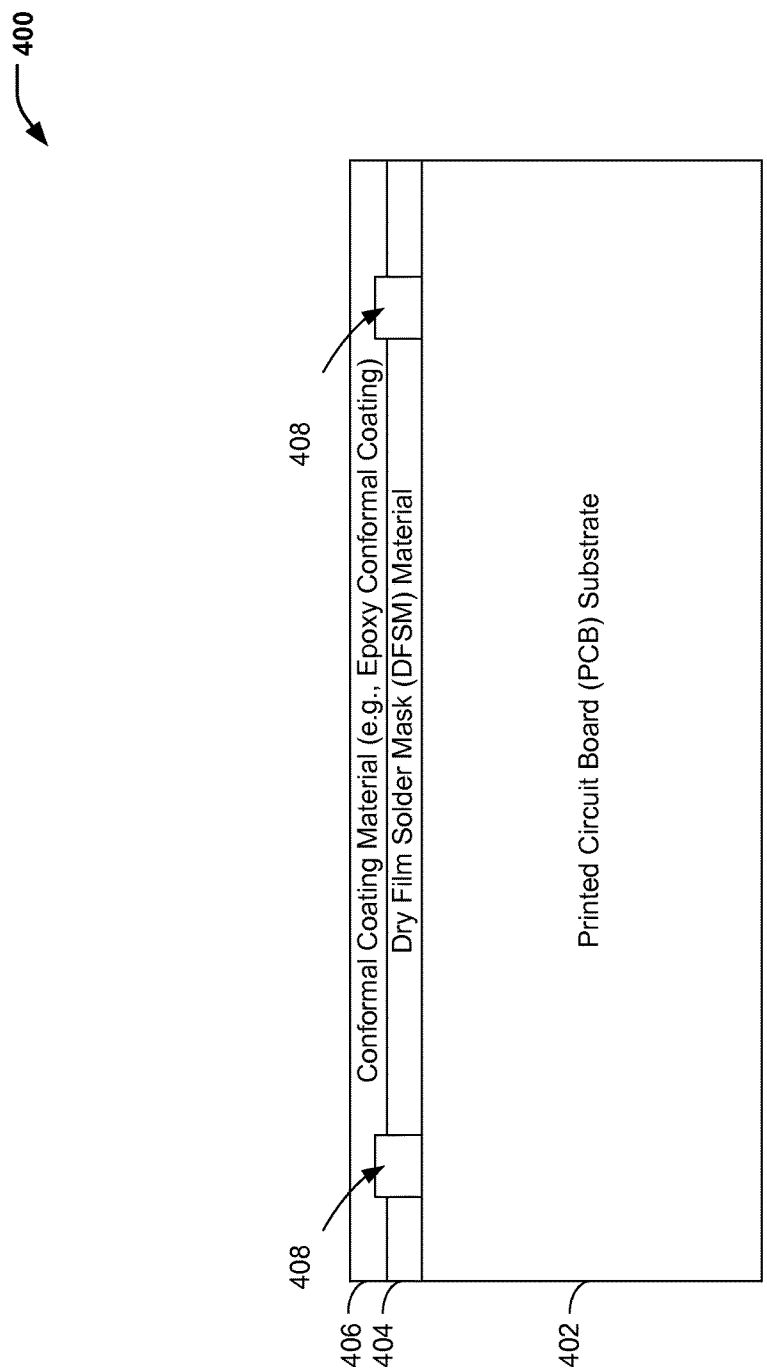
FIG. 4 is a block diagram illustrating an example of a printed circuit board (PCB) that includes a PCB substrate, a DFSM material overlying the PCB substrate, and a conformal coating material reversibly bonded to the DFSM material, according to one embodiment.

As further described herein with respect to FIG. 4, the diene-functionalized DFSM material of FIG. 1 may be applied (e.g., via vacuum lamination) to a PCB substrate of a printed circuit board. After further processing (e.g., selective removal of DFSM material for the addition of circuit elements, such as solder bumps, etc.), the dienophile-functionalized conformal coating material may be applied to the diene-functionalized DFSM material to reversibly bond the conformal coating material to the DFSM material. Additionally, as described further herein with respect to FIG. 6, the reversible nature of the chemical reaction may allow the conformal coating material to be removed/reworked without the use of aggressive techniques.

In the example of FIG. 1, the left side of the chemical reaction diagram 100 illustrates a dienophile-functionalized conformal coating material and a diene-functionalized DFSM material. In the particular embodiment illustrated in FIG. 1, the conformal coating material and the DFSM material are epoxy materials (e.g., the same or different epoxy resins). The right side of the chemical reaction diagram 100 illustrates that a chemical reaction of a dienophile functional group of the modified conformal coating material with a diene functional group of the modified DFSM material results in the conformal coating material being reversibly bonded to the DFSM material. While FIG. 1 illustrates a single dienophile functional group for the conformal coating material and a single diene functional group for the DFSM material, it will be appreciated that this is for illustrative purposes only. Additional functional groups may be distributed along a polymer chain to allow for additional chemical reactions.

In FIG. 1, the left side of the chemical reaction diagram 100 and the right side of the chemical reaction diagram 100 are separated by a forward arrow and a reverse arrow to indicate that the chemical reaction is a reversible reaction. In the particular embodiment illustrated in FIG. 1, a Diels-Alder reaction drives the reaction in a forward direction, and a retro Diels-Alder reaction drives the reaction in a reverse direction.

In the example illustrated in FIG. 1, the right side of the chemical reaction diagram 100 illustrates that the conformal coating material is reversibly bonded to the DFSM material via a cyclic compound (e.g., a bicyclic compound). In FIG. 1, the dienophile functional group of the dienophile-functionalized conformal coating material is an alkene functional group (e.g., a cyclic alkene functional group). The chemical reaction of the alkene functional group with the diene functional group (e.g., a cyclic diene functional group) of the diene-functionalized DFSM material results in the formation of the bicyclic compound.

FIG. 1 illustrates a prophetic example in which the reaction may be reversed by heating (e.g., above about 130° C.) for a particular period of time to reverse the Diels-Alder reaction, allowing the conformal coating material to detach from the DFSM material. As further described herein with respect to FIG. 6, reversibly bonding the conformal coating material to the DFSM material may allow the conformal coating material to be de-bonded from the DFSM material (e.g., to rework the conformal coating material or to apply a second conformal coating material, such as a second dienophile-functionalized epoxy resin material).

As a prophetic example, the dienophile-functionalized epoxy conformal coating material may be applied to the diene-functionalized DFSM material. As further described herein with respect to FIG. 3, a furan protected maleic anhydride of a dienophile-functionalized epoxy conformal coating resin may be de-protected when heated to a particular temperature (e.g., above about 125° C., such as about 130° C.). In the Diels-Alder chemistry illustrated in FIG. 1, the furan has been removed from the dienophile-functionalized conformal coating material as a result of heating. Subsequently, a temperature may be reduced (e.g., to about 70° C.) for a time period of about 2 hours in order to allow the forward reaction to occur. The DFSM material with adhered conformal coating material may then be cooled (e.g., to room temperature).

In the illustrative, non-limiting example of FIG. 1, the conformal coating material includes a dienophile functional group, and the DFSM material includes a diene functional group. In alternative embodiments, the conformal coating material may include the diene functional group, and the DFSM material may include the dienophile functional group. In this case, the reversible nature of the chemical reaction may allow for de-bonding of a first conformal coating material from the DFSM material to form a dienophile-functionalized DFSM material (e.g., to rework a component of a PCB). Subsequently, a second conformal coating material that includes a diene functional group may be applied to the dienophile-functionalized DFSM material. The second conformal coating material may be reversibly bonded to the DFSM material via a chemical reaction of the diene functional group and the dienophile functional group of the dienophile-functionalized DFSM material. As illustrated and further described herein with respect to FIG. 4, the DFSM material 404 may remain bonded to the surface of the PCB substrate 402 after the conformal coating material 406 has been de-bonded. In the case where the DFSM material includes a dienophile functional group rather than a diene functional group, a dienophile-functionalized DFSM material remains bonded to the surface of the PCB substrate 402 after de-bonding the conformal coating material 406.

Thus, FIG. 1 illustrates an example of a conformal coating material (e.g., an epoxy material) that is reversibly bonded to a DFSM material. In FIG. 1, the conformal coating material is reversibly bonded to the DFSM material via a cyclic compound that is formed as a result of a chemical reaction of a dienophile functional group with a diene functional group (e.g., via a Diels-Alder reaction). In the reversible reaction illustrated in FIG. 1, the conformal coating material may be de-bonded from the DFSM material via a non-aggressive technique (e.g., via a retro Diels-Alder reaction). As described further herein with respect to FIG. 6, de-bonding the conformal coating material may allow a component to be reworked without damage to the underlying material(s) that may result from removal of a conformal coating via an aggressive technique.

Figure 2:
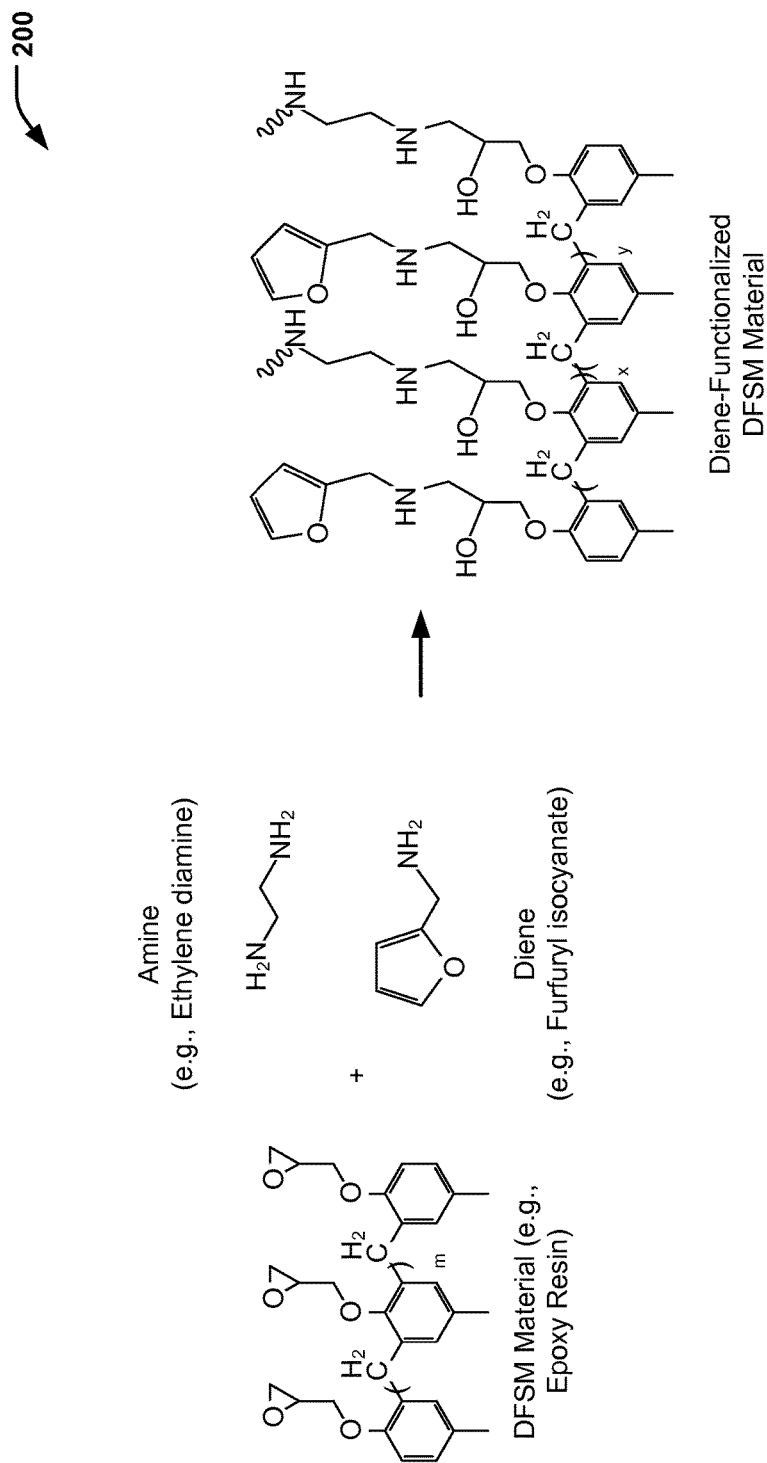
FIG. 2 is a chemical reaction diagram showing the preparation of a diene-functionalized DFSM material, according to one embodiment.

FIG. 2 is a chemical reaction diagram 200 showing the preparation of a diene-functionalized DFSM material, according to one embodiment. As illustrated and further described herein with respect to FIG. 1, a diene functional group of the diene-functionalized DFSM material produced according to the process illustrated in FIG. 2 may be reacted with a dienophile functional group of the dienophile-functionalized conformal coating material (as illustrated and further described herein with respect to FIG. 3) in order to reversibly bond the conformal coating material to the DFSM material.

FIG. 2 illustrates a particular example in which a DFSM material (e.g., an epoxy resin) may be chemically reacted with an amine and a diene to form a (partially) diene-functionalized DFSM material. In the example of FIG. 2, ethylene diamine is an example of an amine, and furfuryl isocyanate is an example of a material that is used to provide the diene functionality. Other DFSM material(s), amine(s), and/or diene(s) may be selected by those skilled in the art.

FIG. 2 illustrates, via a first integer m, that the DFSM material may include multiple repeating epoxy units. FIG. 2 further illustrates, via a second integer x and a third integer y, that a first portion of the epoxy units of the DFSM material may be modified via chemical reaction with the amine (e.g., ethylene diamine) and that a second portion of the epoxy units of the DFSM material may be modified via chemical reaction with the diene (e.g., furfuryl isocyanate), respectively. In some cases, a degree of diene functionalization may be determined based on a functionalization threshold in order to allow for a sufficient number of epoxides to bond the epoxy layers together. To illustrate, in a particular embodiment, a degree of diene functionalization of the DFSM material (represented by the y integer) may be in a range of about 1 to about 50 percent of the epoxy units (represented by the m integer), such as in a range of about 5 to about 40 percent of the epoxy units, in a range of about 10 to about 30 percent of the epoxy units, or in a range of about 15 to about 25 percent, among other alternatives.

Prophetic Example

Synthesis of Diene-Functionalized DFSM Material

As a prophetic example, an epoxy resin (e.g. EPON Resin 162) (20 g) may be added along with ethylene diamine (about 6 molar equivalents), furan-2-ylmethanamine (about 4 molar equivalents), and methanol (50 mL) to a round-bottom flask to form a mixture. The mixture may be heated to about 45° C. and stirred for about 24 hours. The diene-functionalized epoxy resin may then be purified. The diene-functionalized epoxy resin can then be processed into a dry solder film mask.

Figure 3:
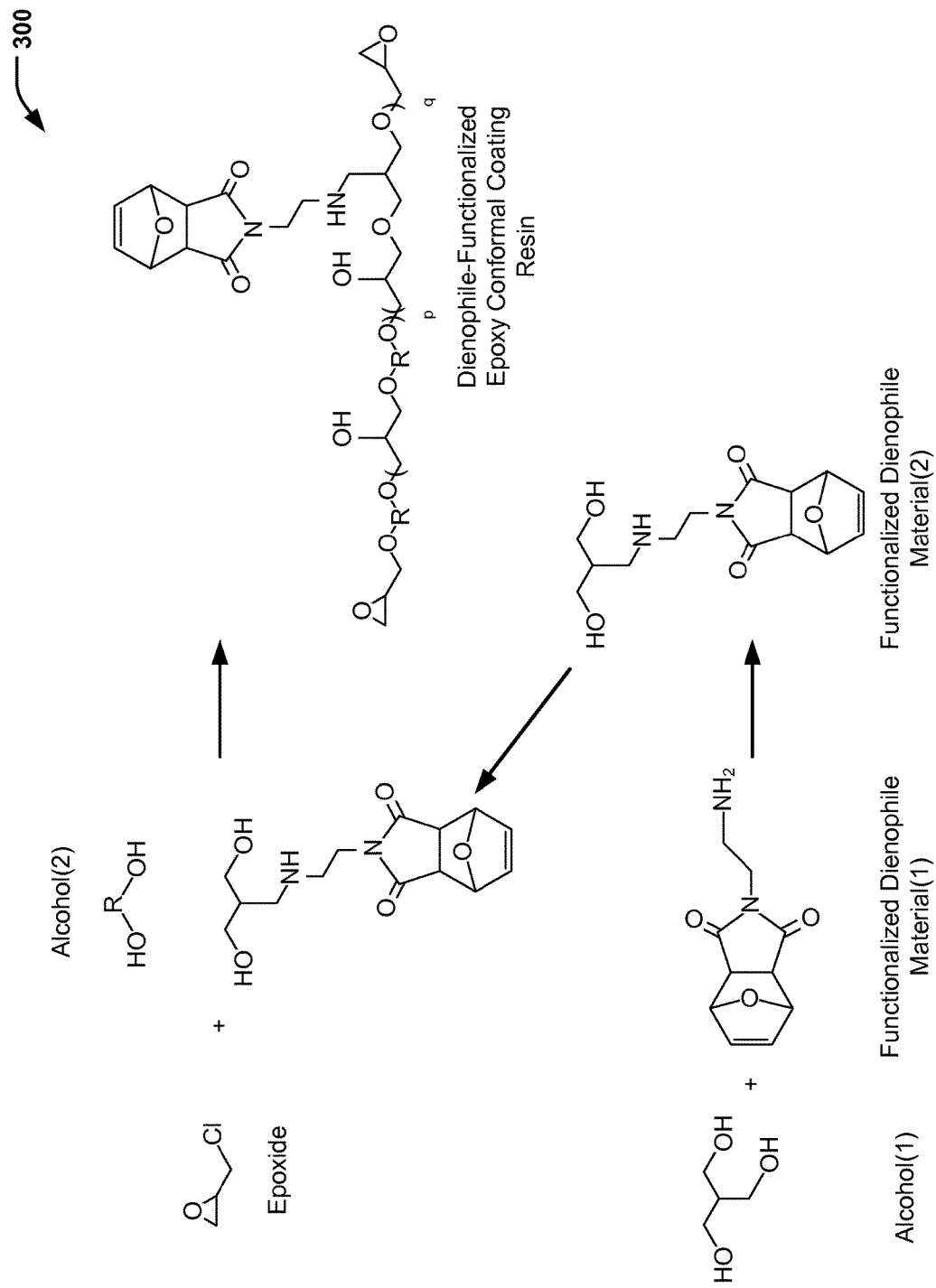
FIG. 3 is a chemical reaction diagram showing the preparation of a dienophile-functionalized conformal coating material, according to one embodiment.

Thus, FIG. 2 illustrates a particular embodiment of a process of functionalizing a DFSM material (e.g., an epoxy resin) to include a diene functional group for reaction with a dienophile functional group of a dienophile-functionalized conformal coating material (e.g., another epoxy resin) that may be formed as described further herein with respect to FIG. 3. As illustrated and further described herein with respect to FIG. 1, the conformal coating material may be reversibly bonded to the DFSM material via a chemical reaction of the diene functional group of the functionalized DFSM material with the dienophile functional group of the functionalized conformal coating material.

FIG. 3 is a chemical reaction diagram 300 showing the preparation of a dienophile-functionalized conformal coating material, according to one embodiment. As illustrated and further described herein with respect to FIG. 1, the diene functional group of the diene-functionalized DFSM material produced according to the process illustrated in FIG. 2 may be reacted with a dienophile functional group of the dienophile-functionalized conformal coating material produced according to the process illustrated in FIG. 3 in order to reversibly bond the conformal coating material to the DFSM material.

In a first chemical reaction shown in FIG. 3 (at the bottom left of FIG. 3), a first functionalized dienophile material (e.g., an amine-functionalized dienophile material) is chemically reacted with an alcohol to form a second functionalized dienophile material (e.g., a hydroxyl-functionalized dienophile material). FIG. 3 further illustrates another chemical reaction (at the top of FIG. 3), in which an epoxide material is reacted with a second alcohol and the second functionalized dienophile material to form a (partially) dienophile-functionalized epoxy conformal coating material.

While not shown in FIG. 3, the first dienophile material (e.g., the amine-functionalized dienophile material) illustrated in the first chemical reaction diagram may be formed via a chemical reaction of a dienophile material and an amine. In the particular embodiment illustrated in FIG. 3, the first functionalized dienophile material is 2-(2-aminoethyl)-3a,4,7,7a-tetrahydro-1H-4,7-epoxyisoindole-1,3(2H)-dione. As an illustrative example, this material may be synthesized via a chemical reaction of a furan-protected maleic anhydride (e.g., 3,6-epoxy-1,2,3,6-tetrahydrophthalic anhydride) and ethylene diamine. Other dienophile material(s) and/or amine(s) may be selected by those skilled in the art.

FIG. 3 illustrates that the chemical reaction of the amine functional group with the furan protected maleic anhydride results in replacement of oxygen with nitrogen to form a strained furan. The strained furan is present in the first functionalized dienophile material (e.g., the amine-functionalized dienophile material) and the second functionalized dienophile material (e.g., the hydroxyl-functionalized dienophile material). Thus, the dienophile functional group of the functionalized dienophile materials of FIG. 3 is in a protected form. The protected maleic anhydride may be de-protected when heated to a particular temperature. For the Diels-Alder chemistry illustrated in FIG. 1, the furan is removed when heated (e.g., above about 125° C.), as shown on the left side of the chemical reaction diagram 100 of FIG. 1.

Prophetic Example

Synthesis of the First Functionalized Dienophile Material (e.g., 2-(2-aminoethyl)-3a,4,7,7a-tetrahydro-1H-4,7-epoxyisoindole-1,3(2H)-dione)

Toluene (50 mL) and exo-3,6-Epoxy-1,2,3,6-tetrahydrophthalic anhydride (0.99 g) may be added to a 100 mL round-bottom flask to form a mixture. The mixture may be stirred, and ethylene diamine (0.72 g) may be added. The reaction may be attached to a condenser and purged under argon. The solution may be heated to about 45° C. and stirred for about 18 hours. After the reaction, toluene may be removed to yield product.

The first chemical reaction diagram of FIG. 3 illustrates that the second functionalized dienophile material (e.g., the hydroxy-functionalized dienophile material) may be formed via a chemical reaction of the first functionalized dienophile material (e.g., the amine-functionalized dienophile material) and an alcohol (identified as "Alcohol(1)" in FIG. 3). In the particular embodiment illustrated in FIG. 3, the alcohol includes 2-(hydroxymethyl)propane-1,3-diol. Other alcohol(s) may be selected by those skilled in the art.

Prophetic Example

Synthesis of the Second Functionalized Dienophile Material (e.g., 2-(2-((3-hydroxy-2-(hydroxymethyl) propyl)amino)ethyl)hexahydro-1H-4,7-epoxyisoindole-1,3(2H)-dione)

Toluene (50 mL) and 2-(hydroxymethyl)propane-1,3-diol (1 g) may be added to a 100 mL round-bottom flask to form a mixture. The mixture may be stirred, and 2-(2-aminoethyl)-3a,3,7,7a-tetrahydro-1H-4,7-epoxyisoindole-1,3 (2H)-dione (1.96 g) may be added. The reaction may be attached to a condenser and purged under argon. The solution may then be heated to about 45° C. and stirred for about 18 hours. After the reaction has completed, toluene may be removed to yield product.

In the second chemical reaction illustrated in FIG. 3 (at the top of FIG. 3), an epoxide material is chemically reacted with an alcohol (identified as "Alcohol(2)" in FIG. 3) and the second functionalized dienophile material (that is used to provide the dienophile functionality). In the example of FIG. 3, the epoxide material includes 2-(chloromethyl)oxirane, and the alcohol includes 1,3-Propanediol. Other epoxide material(s), dienophile material(s), and/or alcohol(s) may be selected by those skilled in the art.

Prophetic Example

Synthesis of a Dienophile-Functionalized Epoxy Conformal Coating Resin

To a round bottom flask, 2-(chloromethyl)oxirane (45 g), 1,3-Propanediol (13.51 g), 2-(2-((3-hydroxy-2-(hydroxymethyl)propyl)amino)ethyl)hexahydro-1H-4,7-epoxyisoindole-1,3(2H)-dione (52.93 g), and methanol (50 mL) may be added to form a mixture. The mixture may be heated to about 45° C. and stirred for about 24 hours. The dienophile-modified epoxy conformal coating resin may be purified. After purification, the maleic anhydride is removed via heating of the conformal coating resin and further purified. The resulting product is a dienophile-modified epoxy conformal coating resin.

FIG. 3 illustrates, via a first integer p and a second integer q, that a first set of the epoxy units of the epoxide material (e.g., 2-(chloromethyl)oxirane) may be modified via chemical reaction with the alcohol (e.g., 1,3-Propanediol) and that a second set of the epoxy units may be modified via chemical reaction with the second functionalized dienophile material (e.g., 2-(2-((3-hydroxy-2-(hydroxymethyl)propyl) amino)ethyl)hexahydro-1H-4,7-epoxyisoindole-1,3(2H)-dione), respectively. In some cases, a degree of dienophile functionalization may be determined based on a functionalization threshold. To illustrate, in a particular embodiment, a degree of dienophile functionalization of the conformal coating material (represented by the n integer) may be in a range of 1 to 50 percent, such as in a range of 5 to 40 percent, in a range of 10 to 30 percent, or in a range of 25 to 35 percent, among other alternatives.

Thus, FIG. 3 illustrates a particular embodiment of a process of functionalizing a conformal coating material (e.g., an epoxy resin) to include a dienophile functional group for reaction with a diene functional group of a diene-functionalized DFSM material (e.g., the diene-functionalized DFSM material of FIG. 2). As illustrated and further described herein with respect to FIG. 1, the conformal coating material may be reversibly bonded to the DFSM material via a chemical reaction of the dienophile functional group of the functionalized conformal coating material with the diene functional group of the functionalized DFSM material.

Referring to FIG. 4, a diagram of a particular embodiment of a printed circuit board including a conformal coating material reversibly bonded to a DFSM material is illustrated and generally designated 400. In a particular embodiment, as described further herein with respect to FIG. 5, the printed circuit board 400 of FIG. 4 may be formed by applying (e.g., vacuum laminating) a DFSM material (e.g., the diene-functionalized DFSM material of FIG. 1) to a PCB substrate. After subsequent processing (e.g., selective removal of DFSM material for the addition of circuit elements), the conformal coating material may be applied and reversibly bonded to the DFSM material (e.g., via Diels-Alder chemistry).

In the particular embodiment illustrated in FIG. 4, the printed circuit board 400 includes a PCB substrate 402, a DFSM material 404 overlying a first portion of the PCB substrate 402, and a conformal coating material 406 overlying the DFSM material 404. FIG. 4 further illustrates that circuit elements 408 (e.g., solder bumps) may be disposed on a second portion of the PCB substrate 402, and the conformal coating material 406 may overly the circuit elements 408 (and the second portion of the PCB substrate 402).

As described further herein, the conformal coating material 406 is reversibly bonded to the DFSM material 404 (e.g., via a cyclic compound). As an example, the cyclic compound that reversibly bonds the conformal coating material 406 to the DFSM material 404 may include a bicyclic compound that is formed via a Diels-Alder reaction, as illustrated and further described herein with respect to FIG. 1. As described further herein, a diene-functionalized DFSM material remains bonded to the surface of the PCB substrate 402 after de-bonding the conformal coating material 406.

Thus, FIG. 4 illustrates a particular embodiment of a printed circuit board having a conformal coating material that is reversibly bonded to a DFSM material (e.g., via a cyclic compound formed via a Diels-Alder reaction). As described further herein with respect to FIG. 6, the reversible nature of the chemical reaction may allow the conformal coating material to be removed from the DFSM material via a non-aggressive technique (e.g., via a retro Diels-Alder reaction). Removal of the conformal coating material may allow an underlying component to be reworked. Subsequently, another conformal coating material may be applied and reversibly bonded to the DFSM material.

Figure 5:
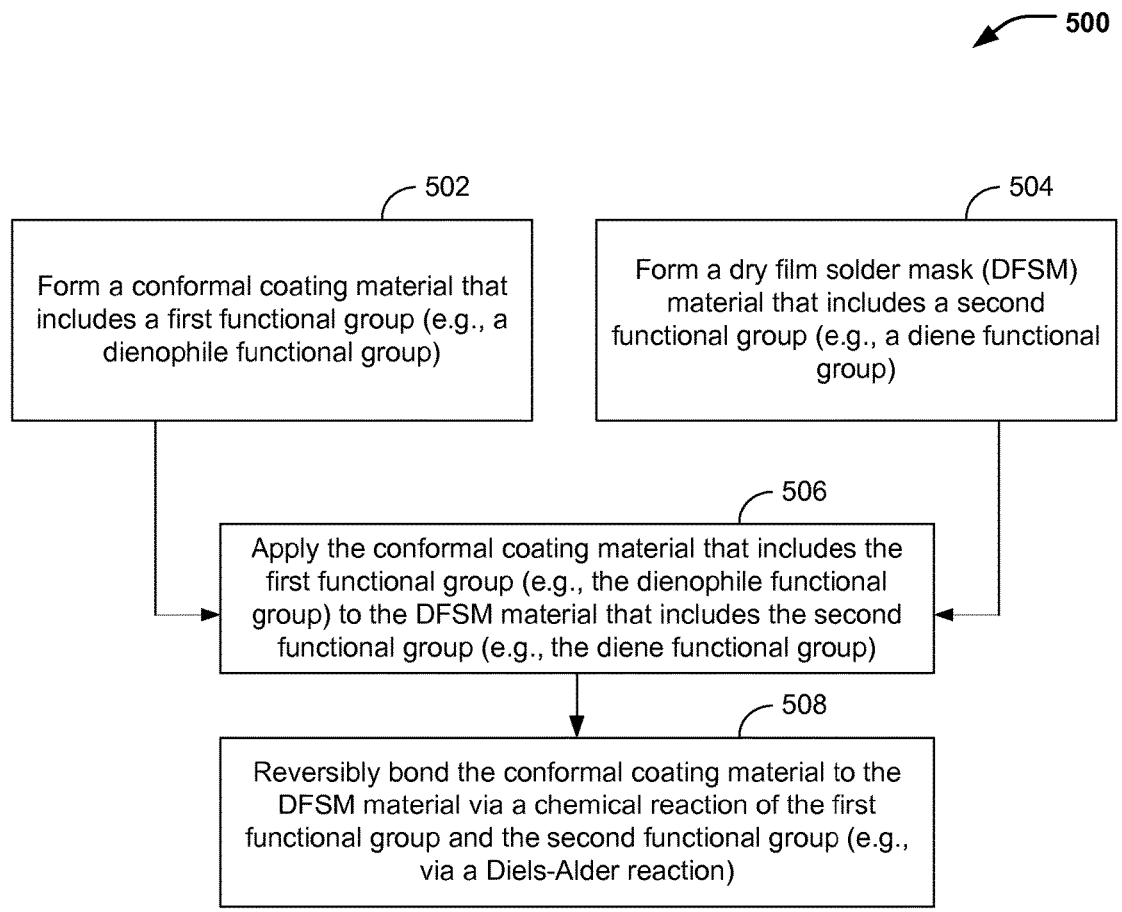
FIG. 5 is a flow diagram showing a particular embodiment of a method of reversibly bonding a conformal coating material to a DFSM material.

FIG. 5 is a flow diagram of a particular embodiment of a method 500 of reversibly bonding a conformal coating material (e.g., an epoxy material) to a DFSM material. FIG. 5 illustrates that a conformal coating material including a first functional group (e.g., a dienophile functional group) may be applied to a DFSM material that includes a second functional group (e.g., a diene functional group). The conformal coating material may be reversibly bonded to the DFSM material via a chemical reaction of the first functional group and the second functional group.

In the particular embodiment illustrated in FIG. 5, a process of forming a functionalized conformal coating is identified as operation 502, and a process of forming a functionalized DFSM material is identified as operation 504. It will be appreciated that the operations shown in FIG. 5 are for illustrative purposes only and that the chemical reactions may be performed in alternative orders, at alternative times, by a single entity or by multiple entities, or a combination thereof. As an example, one entity (e.g., a first specialty chemical manufacturer) may produce the functionalized conformal coating material, while another entity (e.g., a second specialty chemical manufacturer) may produce the functionalized DFSM material. Further, while not shown in the example of FIG. 5, alternative or additional entities (e.g., a printed circuit board manufacturer) may perform operations associated with applying (e.g., vacuum laminating) the DFSM material to a PCB substrate. In addition, alternative or additional entities may perform operations associated with reversibly bonding the conformal coating material to the DFSM material via the chemical reaction of the functional groups (illustrated as operations 506 and 508).

The method 500 includes forming a conformal coating material that includes a first functional group (e.g., a dienophile functional group), at 502. For example, referring to the second chemical reaction illustrated in FIG. 3 (at the top of FIG. 3), the second functionalized dienophile material (e.g., 2-(2-((3-hydroxy-2-(hydroxymethyl)propyl)amino)ethyl) hexahydro-1H-4,7-epoxyisoindole-1,3(2H)-dione) and the alcohol (e.g., 1,3-Propanediol) are chemically reacted with the epoxide material (e.g., 2-(chloromethyl)oxirane) to form the dienophile-functionalized epoxy conformal coating resin. As further described herein with respect to the first chemical reaction illustrated in FIG. 3 (at the bottom of FIG. 3), the second functionalized dienophile material may be formed via a chemical reaction of the first functionalized dienophile material (e.g., 2-(2-aminoethyl)-3a,4,7,7a-tetrahydro-1H-4,7-epoxyisoindole-1,3(2H)-dione) and an alcohol (e.g., 2-(hydroxymethyl)propane-1,3-diol).

The method 500 includes forming a DFSM material that includes a second functional group (e.g., a diene functional group), at 504. For example, referring to FIG. 2, the DFSM material (e.g., an epoxy resin) may be chemically reacted with the amine (e.g., ethylene diamine) and the diene (e.g., furan-2-ylmethanamine) to form the diene-functionalized DFSM material.

The method 500 includes applying the conformal coating material to the DFSM material, at 506. For example, referring to FIG. 1, the dienophile-functionalized conformal coating material may be applied to the diene-functionalized DFSM material. While not shown in the example of FIG. 5, prior to application of the conformal coating material, the diene-functionalized DFSM material may be applied to a PCB substrate. For example, referring to FIG. 4, the DFSM material 404 may be applied to the PCB substrate 402. In a particular embodiment, the DFSM material 404 may be applied to the PCB substrate 402 via vacuum lamination. After applying the DFSM material 404 to the PCB substrate 402, other PCB processing operations may be performed (e.g., formation of the circuit elements 408 via selective removal of the DFSM material 404 from the PCB substrate 402). FIG. 4 illustrates that the conformal coating material 406 may be applied after forming the circuit elements 408, such that the conformal coating material 406 overlies the DFSM material 404 and the circuit elements 408.

The method 500 further includes reversibly bonding the conformal coating material to the DFSM material via a chemical reaction of the first functional group and the second functional group (e.g., via a Diels-Alder reaction), at 508. For example, referring to FIG. 1, the conformal coating material may be reversibly bonded to the DFSM material via the chemical reaction of the dienophile functional group of the dienophile-functionalized conformal coating material and the diene functional group of the diene-functionalized DFSM material. As illustrated in the example of FIG. 1, the materials may be reversibly bonded via a cyclic compound that is formed as a result of a chemical reaction of the alkene functional group of the functionalized conformal coating material with the diene functional group of the functionalized DFSM material (e.g., via a Diels-Alder reaction). In the particular embodiment illustrated in FIG. 1, the alkene functional group is a cyclic alkene functional group, the diene functional group is a cyclic diene functional group, and the cyclic compound is a bicyclic compound.

Thus, FIG. 5 illustrates various operations associated with reversibly bonding a conformal coating material to a DFSM material. While not shown in the example of FIG. 5, in some cases, the conformal coating material may be de-bonded from the DFSM material via a non-aggressive technique (e.g., via a retro Diels-Alder reaction). As further described herein with respect to FIG. 6, reversibly bonding the conformal coating material to the DFSM material may allow the conformal coating material to be removed in order to rework a component without the potential damage to the PCB laminate materials associated with aggressive epoxy conformal coating removal techniques.

Figure 6:
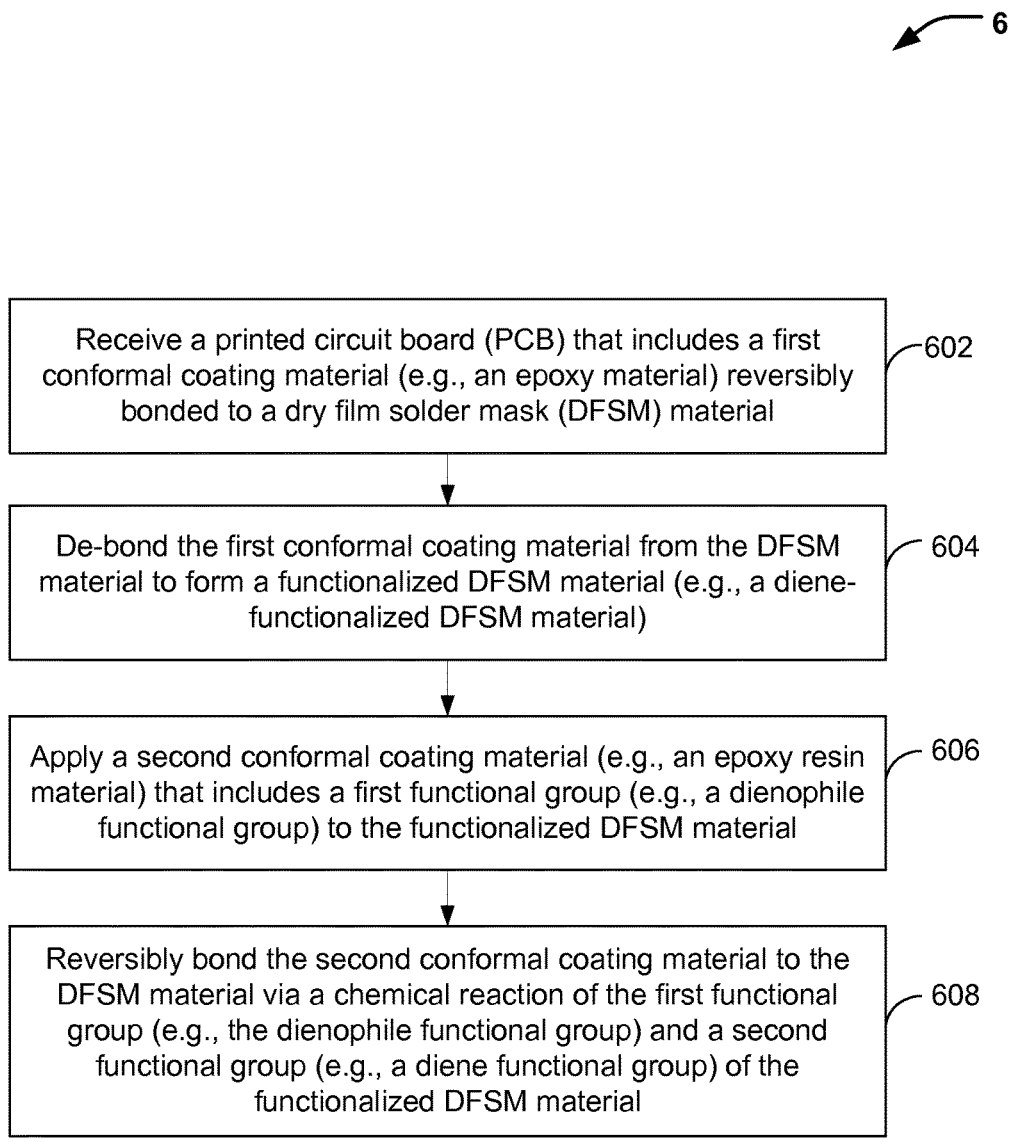
FIG. 6 is a flow diagram showing a particular embodiment of a method of processing a PCB to replace a first conformal coating material that is reversibly bonded to a DFSM material with a second conformal coating material.

FIG. 6 is a flow diagram of a particular embodiment of a method 600 of processing a printed circuit board to replace a first conformal coating material that is reversibly bonded to a DFSM material with a second conformal coating material. As an example, the first conformal coating material may be de-bonded from the printed circuit board in order to rework a component underlying the first conformal coating material. De-bonding the first conformal coating material (e.g., an epoxy conformal coating) via non-aggressive techniques may allow the underlying component to be reworked without potential damage associated with aggressive techniques. After the component has been reworked, another conformal coating material may be applied in order to protect the underlying printed circuit board components.

The method 600 includes receiving a PCB that includes a first conformal coating material (e.g., an epoxy conformal coating) that is reversibly bonded to a DFSM material, at 602. For example, referring to FIG. 4, the printed circuit board 400 includes the conformal coating material 406 reversibly bonded to the DFSM material 404. FIG. 1 illustrates a detailed view of the chemical reaction to reversibly bond the conformal coating material to the DFSM material (e.g., via Diels-Alder chemistry).

The method 600 includes de-bonding the first conformal coating material from the DFSM material to form a functionalized DFSM material (e.g., a diene-functionalized DFSM material), at 604. For example, referring to FIG. 4, de-bonding the conformal coating material 406 from the DFSM material 404 results in reversal of the Diels-Alder chemistry illustrated in FIG. 1 to form the diene-functionalized DFSM material of FIG. 1. For example, the Diels-Alder reaction may be reversed by heating above about 130° C. for a particular period of time. Accordingly, after removal of the conformal coating material 406, the DFSM material 404 illustrated in FIG. 4 includes a diene functional group (referred to herein as a second functional group) that is available for subsequent reaction with a dienophile functional group (referred to herein as a first functional group) of another conformal coating material.

The method 600 includes applying a second conformal coating material (e.g., an epoxy resin material) to the functionalized DFSM material, at 606. The second conformal coating material includes a first functional group (e.g., a dienophile functional group). For example, referring to FIG. 1, the second conformal coating material may correspond to the dienophile-functionalized conformal coating material. As illustrated in the example of FIG. 1, the dienophile-functionalized conformal coating material may be applied to the diene-functionalized DFSM material.

The method 600 includes reversibly bonding the second conformal coating material to the DFSM material, at 608. The second conformal coating is reversibly bonded to the DFSM material via a chemical reaction of the first functional group (e.g., the dienophile functional group) and the second functional group (e.g., the diene functional group). For example, referring to FIG. 1, the conformal coating material may be reversibly bonded to the DFSM material via a chemical reaction of the dienophile functional group and the diene functional group.

Thus, FIG. 6 illustrates that the ability to de-bond (e.g., via a retro Diels-Alder reaction) a conformal coating material that is reversibly bonded to a DFSM material of a printed circuit board may allow a component to be reworked without aggressive techniques (e.g., without solvent-based techniques). After the component has been reworked, another conformal coating material may be applied and reversibly bonded (e.g., via a Diels-Alder reaction) to the DFSM material of the printed circuit board.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A process for reversibly bonding a conformal coating material to a dry film solder mask (DFSM) material, the process comprising:
    applying a first conformal coating material to a dry film solder mask (DFSM) material, wherein the first conformal coating material includes a first functional group, and wherein the DFSM material includes a second functional group that is different from the first functional group; and
    reversibly bonding the first conformal coating material to the DFSM material via a chemical reaction of the first functional group and the second functional group.

2. The process of claim 1, wherein the first functional group includes a dienophile functional group, and wherein the second functional group includes a diene functional group.

3. The process of claim 2, further comprising:
    de-bonding the first conformal coating material from the DFSM material to form a diene-functionalized DFSM material;
    applying a second conformal coating material to the diene-functionalized DFSM material, wherein the second conformal coating material includes a second dienophile functional group; and
    reversibly bonding the second conformal coating material to the DFSM material via a chemical reaction of the second dienophile functional group and a diene functional group of the diene-functionalized DFSM material.

4. The process of claim 3, wherein:
    the first conformal coating material is reversibly bonded to the DFSM material via a first cyclic compound; and
    the second conformal coating material is reversibly bonded to the DFSM material via a second cyclic compound that is formed as a result of the chemical reaction of the second diene functional group and the diene functional group of the diene-functionalized DFSM material.

5. The process of claim 4, wherein the first cyclic compound and the second compound are bicyclic compounds.

6. The process of claim 3, wherein the DFSM material is bonded to a surface of a printed circuit board (PCB) substrate, and wherein the diene-functionalized DFSM material remains bonded to the surface of the PCB substrate after de-bonding the first conformal coating material.

7. The process of claim 1, wherein the first conformal coating material includes an epoxy resin material.

8. The process of claim 1, wherein the first conformal coating material is reversibly bonded to the DFSM material via a Diels-Alder reaction.

9. The process of claim 1, wherein:
the first functional group is an alkene functional group;
the second functional group is a diene functional group;
the chemical reaction of the alkene functional group with the diene functional group forms a cyclic compound; and
the first conformal coating material is reversibly bonded to the DFSM material via the cyclic compound.

10. The process of claim 9, wherein:
the alkene functional group is a cyclic alkene functional group;
the diene functional group is a cyclic diene functional group; and
the cyclic compound is a bicyclic compound.

11. The process of claim 1, wherein the first functional group includes a diene functional group, and wherein the second functional group includes a dienophile functional group.

12. The process of claim 11, further comprising:
de-bonding the first conformal coating material from the DFSM material to form a dienophile-functionalized DFSM material;
applying a second conformal coating material to the dienophile-functionalized DFSM material, wherein the second conformal coating material includes a second diene functional group; and
reversibly bonding the second conformal coating material to the DFSM material via a chemical reaction of the second diene functional group with the dienophile functional group of the dienophile-functionalized DFSM material.

13. The process of claim 12, wherein the DFSM material is bonded to a surface of a printed circuit board (PCB) substrate, and wherein the dienophile-functionalized DFSM material remains bonded to the surface of the PCB substrate after de-bonding the first conformal coating material.

14. A method of processing a printed circuit board (PCB), the method comprising:
receiving a printed circuit board (PCB) that includes a first conformal coating material reversibly bonded to a dry film solder mask (DFSM) material;
de-bonding the first conformal coating material from the DFSM material to form a functionalized DFSM material;
applying a second conformal coating material to the functionalized DFSM material, wherein the second conformal coating material includes a first functional group; and
reversibly bonding the second conformal coating material to the DFSM material via a chemical reaction of the first functional group and a second functional group of the functionalized DFSM material.

15. The method of claim 14, wherein the first conformal coating material includes an epoxy material, wherein the second conformal coating material includes an epoxy resin material, wherein the PCB includes a PCB substrate having a first portion and a second portion, wherein a plurality of circuit elements overlie the second portion of the PCB substrate, and wherein the second conformal coating material overlies the first portion and the second portion.

16. The method of claim 14, wherein the first functional group includes a dienophile functional group, and wherein the second functional group includes a diene functional group.

* * * * *